United States Patent
Levasier et al.

(10) Patent No.: US 6,955,074 B2
(45) Date of Patent: Oct. 18, 2005

(54) LITHOGRAPHIC APPARATUS, METHOD OF CALIBRATION, CALIBRATION PLATE, DEVICE MANUFACTURING METHOD, AND DEVICE MANUFACTURED THEREBY

(75) Inventors: Leon Martin Levasier, Hedel (NL); Anastasius Jacobus Anicetus Bruinsma, Delft (NL); Jacob Fredrik Friso Klinkhamer, Delft (NL); Gerrit Johannes Nijmeijer, Eindhoven (NL); Petra Albertina Margaretha Dekkers-Rog, Eindhoven (NL)

(73) Assignee: ASML Netherlands, B.V., Veldhoven (NL)

( * ) Notice: Subject to any disclaimer, the term of this patent is extended or adjusted under 35 U.S.C. 154(b) by 0 days.

(21) Appl. No.: 10/746,141

(22) Filed: Dec. 29, 2003

(65) Prior Publication Data

US 2005/0138988 A1 Jun. 30, 2005

(51) Int. Cl.[7] ............................................. G01B 21/00
(52) U.S. Cl. .................................................... 73/1.81
(58) Field of Search ........................... 73/1.81, 1.79, 73/1.89; 250/492.22

(56) References Cited

U.S. PATENT DOCUMENTS

| | | | | |
|---|---|---|---|---|
| 4,858,556 A | * | 8/1989 | Siebert | 118/664 |
| 5,229,872 A | * | 7/1993 | Mumola | 349/2 |
| 5,644,400 A | * | 7/1997 | Mundt | 356/400 |
| 5,661,548 A | * | 8/1997 | Imai | 355/55 |
| 5,969,441 A | * | 10/1999 | Loopstra et al. | 310/12 |
| 6,046,792 A | * | 4/2000 | Van Der Werf et al. | 355/53 |
| 6,062,062 A | * | 5/2000 | Toida et al. | 73/1.81 |
| 6,096,567 A | * | 8/2000 | Kaplan et al. | 438/14 |
| 6,542,839 B1 | * | 4/2003 | Lu et al. | 702/94 |
| 6,549,271 B2 | * | 4/2003 | Yasuda et al. | 355/55 |
| 6,630,681 B1 | * | 10/2003 | Kojima | 250/492.22 |
| 6,640,607 B2 | * | 11/2003 | Abbe | 73/1.01 |
| 6,772,620 B1 | * | 8/2004 | Poris | 73/1.81 |

FOREIGN PATENT DOCUMENTS

| | | | | |
|---|---|---|---|---|
| JP | WO 9932940 A1 | * | 7/1999 | G03F 9/00 |
| WO | WO 9839689 A1 | * | 9/1998 | G03F 9/00 |

\* cited by examiner

Primary Examiner—Hezron Williams
Assistant Examiner—John Fitzgerald
(74) Attorney, Agent, or Firm—Pillsbury Winthrop Shaw Pittman LLP

(57) ABSTRACT

A method according to one embodiment of the invention may be performed using a calibration plate having at least one alignment marker and at least one height profile. First, the calibration plate is positioned using an alignment sensor. Then the height profile is measured by a height sensor. Then the calibration plate is rotated by substantially 180 degrees and the two operations are repeated. This procedure results in two measured height profiles, which are compared in order to find a best fit. The amount of shift performed to find the best fit is used to determine a distance between the alignment marker and the X,Y position of the measurement point of the height sensor.

27 Claims, 6 Drawing Sheets

LITHOGRAPHIC APPARATUS, METHOD OF CALIBRATION, CALIBRATION PLATE, DEVICE MANUFACTURING METHOD, AND DEVICE MANUFACTURED THEREBY

FIELD OF THE INVENTION

The present invention relates to lithographic apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and No. 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

The support structure supports, i.e. bears the weight of, the patterning means. It holds the patterning means in a way depending on the orientation of the patterning means, the design of the lithographic apparatus, and other conditions, such as for example whether or not the patterning means is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning means is at a desired position, for example with respect to the projection system. Any use of the terms "reticle" or "mask" herein may be considered synonymous with the more general term "patterning means".

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, catadioptric systems, and charged particle optics, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation or particle flux, including ultraviolet radiation (e.g. with a wavelength of 365, 248, 193, 157 or 126 nm), EUV (extreme ultra-violet radiation, e.g. having a wavelength in the range 5–20 nm), and X-rays, as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "reticle," "wafer," or "die" in this text should be considered as being replaced by the more general terms "mask," "substrate," and "target portion" (or "exposure area"), respectively.

Measurements of height and position of a substrate may be performed using different sensors. Therefore, such measurements may relate to different areas of the substrate. It may be desirable to calibrate a measurement location of a height sensor with respect to a position as measured by an alignment sensor.

SUMMARY

A method of calibration according to one embodiment of the invention includes moving a marker of a calibration plate to an alignment position and using a height sensor to measure a first height profile of the calibration plate. Subsequent to moving the marker and using the height sensor to measure the first height profile, the method includes rotating the calibration plate by substantially 180 degrees and, subsequent to the rotating, moving the marker to the alignment position again and using the height sensor to measure a second height profile of the calibration plate. A position of a measurement spot of the height sensor with respect to the alignment position is determined, based on the first and second height profiles. Further embodiments of the invention include calibration plates, lithographic apparatus, and device manufacturing methods.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, methods and apparatus that may be used to calibrate the X,Y position of a measuring point of a height sensor with reference to a measurement point of an X,Y alignment sensor with an increased accuracy.

Figure 1:
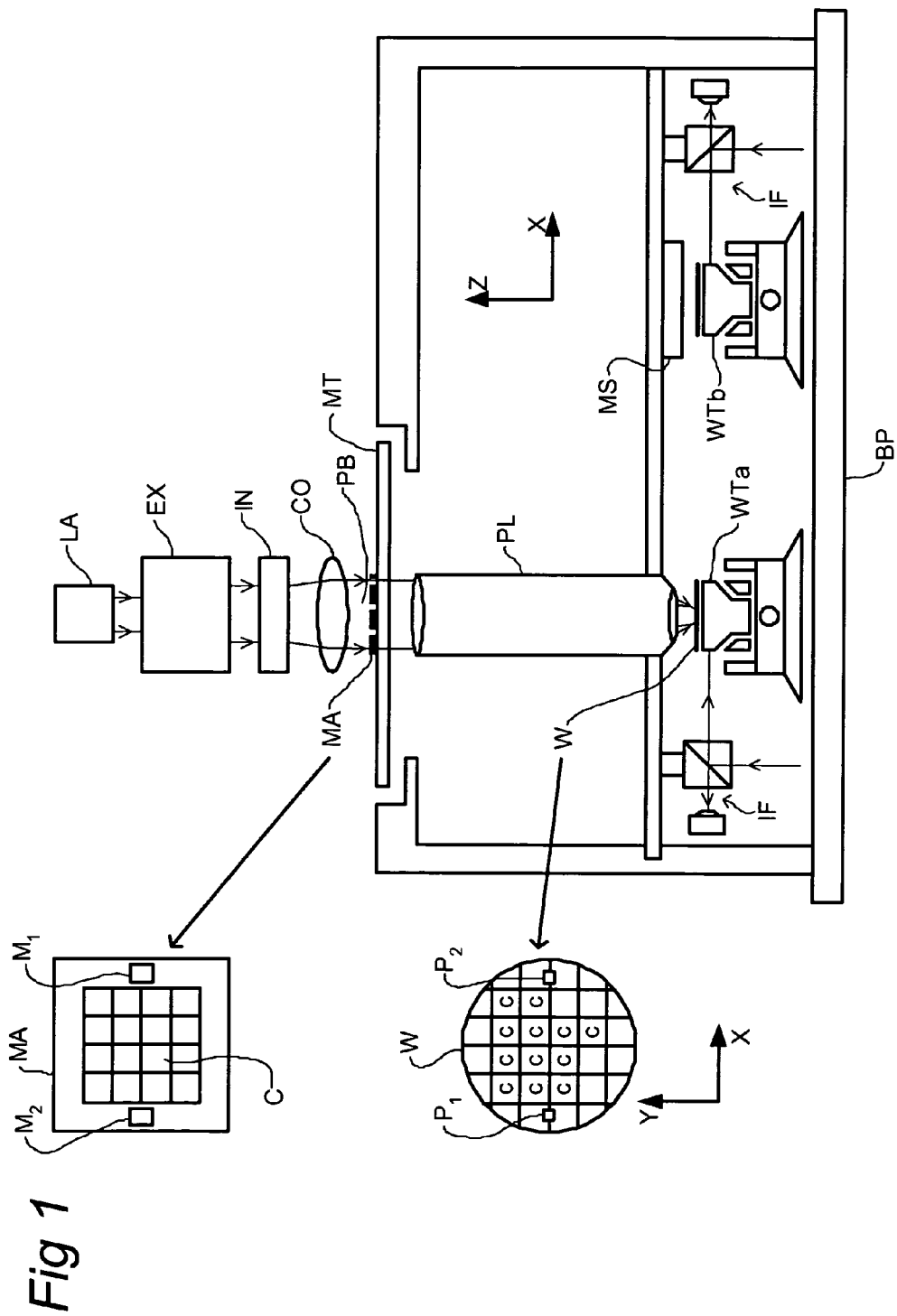
FIG. 1 depicts a lithographic apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation (e.g. UV or EUV radiation). In this particular example, the radiation system RS comprises a radiation source LA, a beam expander Ex, and an illumination system including an integrator IN and condensing optics CO (and possibly also an adjusting structure AM for setting an illumination node);

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WTa is provided with a substrate holder for holding a substrate W (e.g. a resist-coated semiconductor wafer), and is connected to a second positioning structure for accurately positioning the substrate with respect to item PL and (e.g. interferometric) measurement structure IF, which is configured to accurately indicate the position of the substrate and/or substrate table with respect to lens PL;

A third object table (substrate table) configured to hold a substrate. In this example, substrate table WTb is provided with a substrate holder for holding a substrate W (e.g. a resist-coated semiconductor wafer), and is connected to a third positioning structure for accurately positioning the substrate with respect to item PL and another (e.g. interferometric) measurement structure IF, which is configured to accurately indicate the position of the substrate and/or substrate table with respect to lens PL or another portion of the apparatus (e.g. measurement system MS);

A measurement system MS configured to perform a measurement (e.g. characterization) process on a substrate held on a substrate table WTa or WTb at a measurement station; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source LA (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second (third) positioning structure (and interferometric measuring structure IF), the substrate table WTa (WTb) can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WTa, WTb will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator (e.g. to make fine adjustments in mask orientation and position) or may be fixed. Mask MA and substrate W may be aligned using mask alignment marks M1, M2 and substrate alignment marks P1, P2.

The second and third positioning structures may be constructed so as to be able to position their respective substrate tables WTa, WTb over a range encompassing both the exposure station under projection system PL and the measurement station under the measurement system MS. Alternatively, the second and third positioning structures may be replaced by separate exposure station and measurement station positioning systems configured to position a substrate table in the respective exposure stations, and a table exchange structure configured to exchange the substrate tables between the two positioning systems. Suitable positioning systems are described, inter alia, in Patent Applications WO 98/28665 and WO 98/40791 mentioned above. It should be noted that a lithography apparatus may have multiple exposure stations and/or multiple measurement stations, that the numbers of measurement and exposure stations may be different than each other, and the total number of stations need not equal the number of substrate tables. Indeed, the principle of separate exposure and measurement stations may be employed even with a single substrate table.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB. In step mode, a maximum size of the exposure field may limit the size of the target portion imaged in a single static exposure;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). The velocity and/or direction of the substrate table WT relative to the mask table MT may be determined by magnification, demagnification (reduction), and/or image reversal characteristics of the projection system PL. In this manner, a relatively large target portion C can be exposed, without having to compromise on resolution. In scan mode, a maximum size of the exposure field may limit the width (in the non-scanning direction) of the target portion exposed in a single dynamic exposure, whereas the length of the scanning motion may determine the height (in the scanning direction) of the target portion exposed;

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

Until very recently, lithographic apparatus contained a single mask table and a single substrate table. However, machines are now becoming available in which there are at least two independently moveable substrate tables; see, for example, the multi-stage apparatus described in International Patent Applications WO98/28665 and WO98/40791. The basic operating principle behind such multi-stage apparatus is that, while a first substrate table is at an exposure station underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure station underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and measurement station.

Measurements performed on the substrate at the measurement station may, for example, include a determination of the spatial relationship (in X and Y directions) between various contemplated exposure areas on the substrate ("dies"), reference markers on the substrate, and at least one reference marker (e.g. fiducial) located on the substrate table outside the area of the substrate. Such information can subsequently be employed at the exposure station to perform a fast and accurate X and Y positioning of the exposure areas with respect to the projection beam (for more information, see WO 99/32940, for example).

Patent Application WO 99/32940 also describes preparation at the measurement station of a height map relating the Z position of the substrate surface at various points to a reference plane of the substrate holder. The height map may be used to position the wafer at the exposure station at the correct Z position. Furthermore, the height map may be used to define a correct tilt of the substrate table at the exposure station.

The substrate table can tilt around two tilt axes, perpendicular to each other. The position of these tilt axes can be adjusted by an adjusting structure. Since the initial X,Z (or Y,Z) position of a tilt axis may not be known precisely, it may be desirable or necessary to find the position of the tilt axis and possibly to adjust it. Furthermore, it may be desirable or necessary to adjust the tilt axis of the substrate table at the exposure station and at the measurement station so that the height map can be used correctly. In order to find the exact position of a tilt axis, a calibration method may be used wherein a height sensor is used to find a tilt-independent position of the substrate table.

Since the X,Y position of a measurement point of a height sensor with reference to a standard X,Y reference may not be exactly known (due to tolerances), it may be desirable or necessary to determine this position exactly in advance. The X,Y position of the measurement spot of the height sensor may be determined using a calibration plate consisting a height profile and a X,Y-alignment marker. In the calibration plate, the distance between the height profile and the X,Y-alignment marker is manufactured with high accuracy. However, a potential disadvantage of such a method is that it is may not be possible to make a calibration plate in which the distance between the X,Y-alignment marker and the height profile is known very accurately.

Figure 2:
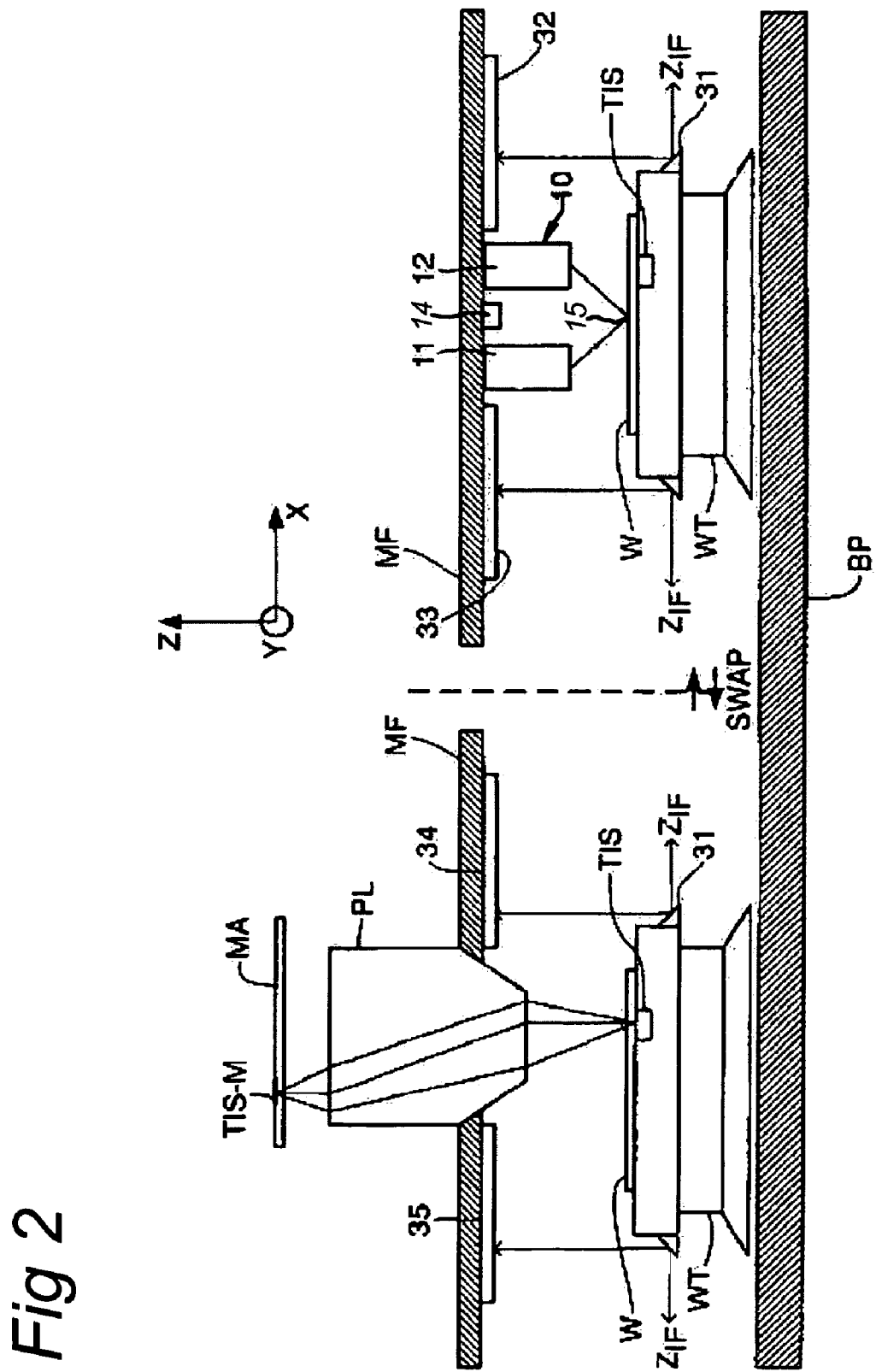
FIG. 2 depicts the lithographic apparatus of FIG. 1 in more detail.

FIG. 2 shows in more detail the lithographic apparatus of FIG. 1. FIG. 2 shows only the exposure and measurement stations and only components relevant to the discussion below. At the exposure station, to the left of FIG. 2, the projection lens PL is shown mounted to metrology frame MF. A Transmission Image Sensor (TIS) is mounted to the substrate table WT. The projection lens PL can project an image of a marker TIS-M on mask MA onto the TIS. The marker TIS-M may be used for alignment of the mask MA to the sensor TIS in the substrate table WT, e.g. using an exposure light source of the apparatus.

The metrology frame MF may be isolated from the transmission of vibrations from other parts of the apparatus and have mounted on it only passive components used for fine metrology and alignment sensing. For example, components mounted on the metrology frame MF may include mirrors 32, 34 and 35, 33 to which the measurement beams of a Z-interferometer $Z_{IF}$ are directed by 45°-mirrors 31 mounted on the sides of the wafer table WT. To ensure that the Z position of the substrate table can be measured throughout its range of movement in X, the mirrors 32, 33, 34, 35 may have a correspondingly large extent in the X direction. To ensure the Z position can be measured throughout the range of Y-movement, the mirrors 31 may cover the whole length of the wafer table.

At the measurement station, a height sensor 10 (comprising beam generating part 11 and detection part 12) is mounted on the metrology frame MF. An X,Y alignment module 14 is provided at the measurement station. The alignment module 14 may comprise an alignment sensor as described in WO 98/39689. Such a sensor is able to locate an alignment marker very accurately. The X,Y position of the alignment marker is used to calibrate the X,Y position of a measure spot 15 of the height sensor 10 (see FIG. 2).

In at least one application of a calibration method according to an embodiment of the invention, the tilt axis calibration can accurately be performed by the height sensor 10. To make a reliable tilt axis calibration possible, it may be desirable or necessary to calibrate the position of a measurement spot 15 of the height sensor 10, with reference to an X,Y position measured by the alignment sensor 14, e.g. to a high degree of accuracy.

In such a method, the position calibration of the measurement spot 15 of the height sensor 10 may be performed by measuring a calibration plate before and after a rotation of 180 degrees. Below, a problem that may thereby be solved will be explained with reference to FIGS. 3 and 4.

Figure 3:
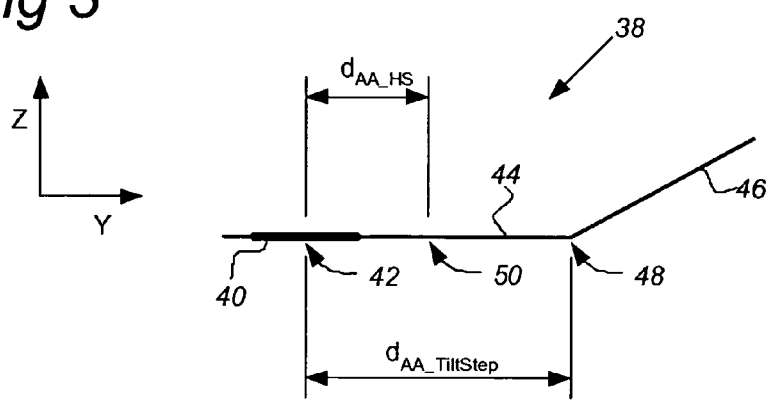
FIG. 3 shows part of a top surface of a calibration plate according to an embodiment of the invention.

FIG. 3 shows part of a cross section of a calibration plate 38 according to an embodiment of the invention. In one implementation, the calibration plate 38 is located on a special calibration wafer. It may be desirable or necessary to position such a calibration wafer on the substrate table WT before calibration takes place. Another option is to locate the calibration plate 38 on the substrate table WT itself, but fabricating the calibration plate 38 on a special wafer may be less complicated.

The calibration plate 38 comprises an alignment marker 40 positioned at a marker position 42 (e.g. an X,Y position measured by the alignment sensor). The calibration plate 38 also comprises a flat surface 44 and a sloped surface 46. At a transition point 48, the two surfaces 44 and 46 meet. The two surfaces may for example have rectangular shapes, but other shapes are possible.

In FIG. 3, Y and Z-directions correspond to the Y and Z-directions of the substrate table WT in FIG. 2. By moving the substrate table WT, it is possible to position an initial measurement spot 15 of the height sensor 10 near the alignment marker 40. In practice, there is a tolerance depicted in FIG. 3 as $d_{AA\_HS}$. The distance $d_{AA\_HS}$ may be unknown, and one reason to perform the calibration may be to determine this distance.

Figure 4:
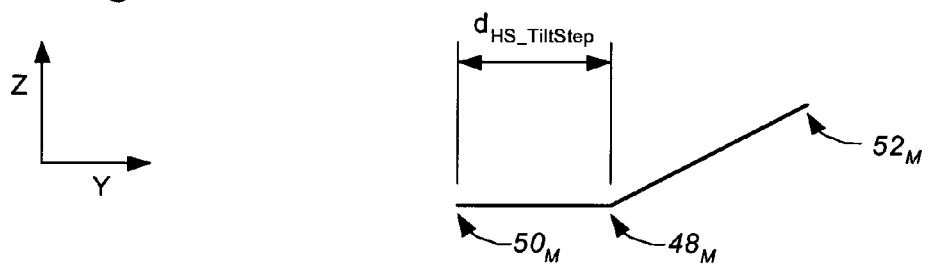
FIG. 4 shows a measured height profile of the calibration plate of FIG. 3.

In FIG. 3 the distance between the marker position 42 and the transition point 48 is depicted as $d_{AA\_Tiltstep}$. First, we assume that the distance $d_{AA\_Tiltstep}$ may be known precisely. By positioning the measurement spot 15 of the height sensor 10 at position 50 and moving the substrate table WT in order to measure the calibration plate 38, a height profile of the calibration plate 38 is measured which is shown in FIG. 4. In the height profile of FIG. 4, the positions $48_M$ and $50_M$ correspond to the positions 48 and 50, respectively, of FIG. 3, and the end of the measurement is indicated by position $52_M$. The distance between the initial measure position $50_M$ of the height sensor measuring spot 15 and the determined transition point $48_M$ is depicted as $d_{HS\_Tiltstep}$. Now, the distance between the marker position 42 and the initial measure position 50 of the height sensor 10, may be calculated with the formula:

$$d_{AA\_HS} = d_{AA\_Tiltstep} - d_{HS\_Tiltstep}.$$

However, as mentioned above, it may not be possible, feasible, or practical to know the distance $d_{AA\_Tiltstep}$ with high accuracy. In at least some applications of a method according to an embodiment of the invention, a problem of not knowing the exact distance between the marker position 42 and the transition point 48 may be avoided by rotating the calibration plate 180 degrees and repeating the measurement of the height profile. In this case, a calculation is possible wherein the unknown distance $d_{AA\_Tiltstep}$ is eliminated from the calculation.

In a calibration method according to one embodiment of the invention, a calibration plate is used as depicted in FIG. 3. The method includes rotating the calibration plate 38 by 180 degrees after measuring a first height profile. Rotation of the calibration plate 38 can be achieved, for example, by rotating the substrate table WT and translating the substrate table WT so that the alignment marker 40 is positioned (e.g. exactly) under the AA-sensor.

Figure 5:
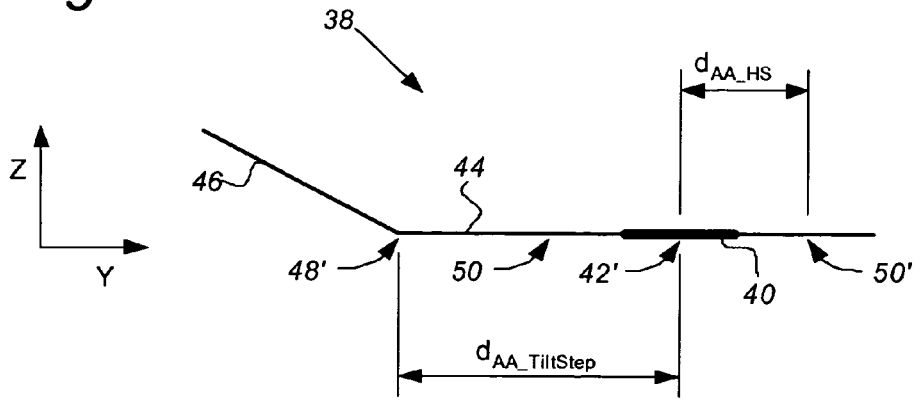
FIG. 5 shows part of a top surface of a calibration plate after rotation according to an embodiment of the invention.

FIG. 5 shows the calibration plate 38 of FIG. 3 but after rotation of 180 degrees. The alignment marker 40 is at a position 42', and the initial height sensor measuring spot 15 is at position 50'. The transition between surface 44 and sloped surface 46 occurs at a position 48'.

Figure 6:
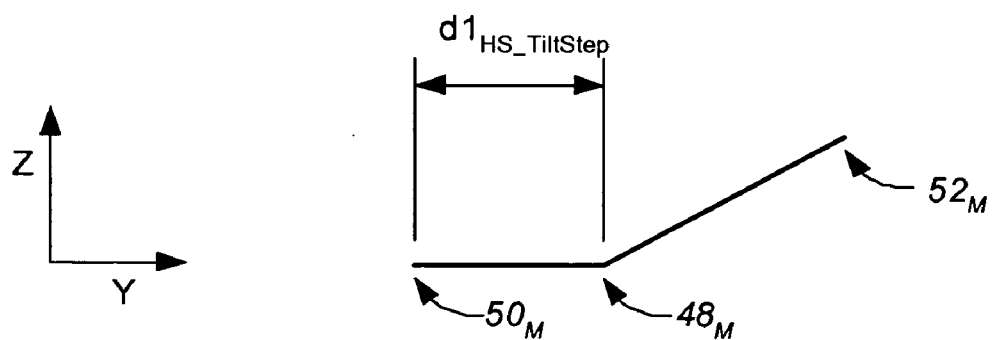
FIG. 6 shows a measured height profile of the calibration plate of FIG. 3.
Figure 7:
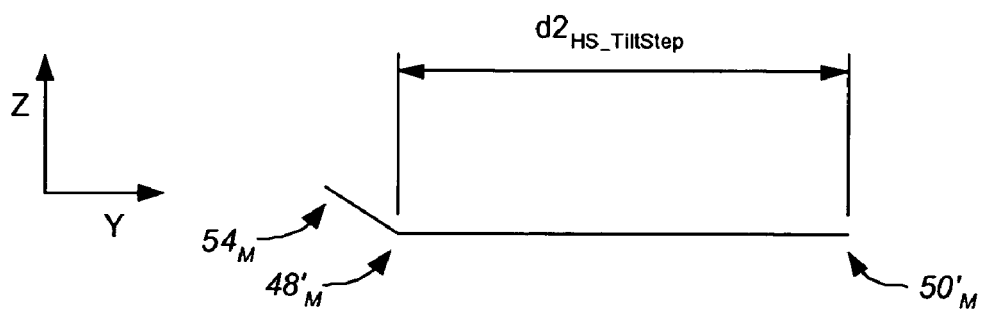
FIG. 7 shows a measured height profile of the calibration plate of FIG. 5.

FIG. 6 shows a height profile measured by height sensor 10 when scanning the calibration plate 38 positioned as in FIG. 3. The height profile resembles the one shown in FIG. 4. In FIG. 6, the distance between the measured transition position $48_M$ and the initial measurement $50_M$ is indicated as $d1_{HS\_Tiltstep}$. After rotating the calibration plate 38, the calibration plate 38 is measured again, and a result is obtained as shown in FIG. 7. In FIG. 7, the distance between the measured transition position $48'_M$ and the beginning of the measurement, i.e. position $50'_M$, is indicated as $d2_{HS\_Tiltstep}$. It may be assumed that the following equation holds:

$$d_{AA\_HS} = d_{AA\_Tiltstep} - d1_{HS\_Tiltstep} = d2_{HS\_Tiltstep}.$$

From this equation the following can be derived:

$$d_{AA\_HS} = (d2_{HS\_Tiltstep} - d1_{HS\_Tiltstep})/2.$$

It may be seen that the difference between the alignment marker 40 and the tilt step, i.e. $d_{AA\_Tiltstep}$, is not present in this calculation for $d_{AA\_HS}$. Rotating the calibration plate 38 by 180 degrees, as in a method according to an embodiment of the invention, may solve a problem of an unknown distance between the alignment marker 40 and the tilt step.

The calibration plate 38 may comprise a more arbitrary height profile. The calculation of $d_{AA\_HS}$ may then become slightly more complicated. Below, an embodiment of the invention that may be applied to such a case is explained with reference to FIGS. 8–13.

Figure 8:
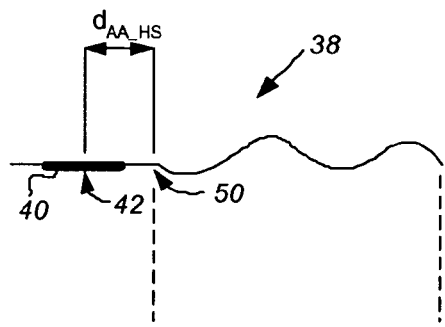
FIG. 8 shows part of a top surface of a calibration plate according to another embodiment of the invention.
Figure 9:
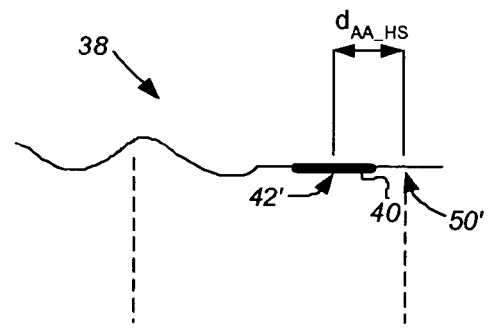
FIG. 9 shows part of a top surface of a calibration plate according to FIG. 8 after rotation.

FIGS. 8 and 9 show a calibration plate 38 before and after rotation, respectively, according to an embodiment. The alignment marker 40 is positioned at position 42, 42', and the height sensor 10 starts measuring at initial measuring position 50, 50', respectively. Height profiles as measured by the height sensor 10 are shown in FIGS. 10 and 11.

Figure 10:
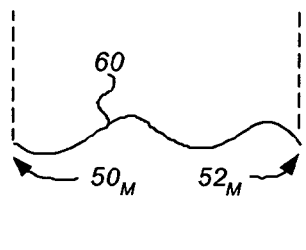
FIG. 10 shows a measured height profile of the calibration plate of FIG. 8.

FIG. 10 shows a measured height profile 60 before rotation, and

Figure 11:
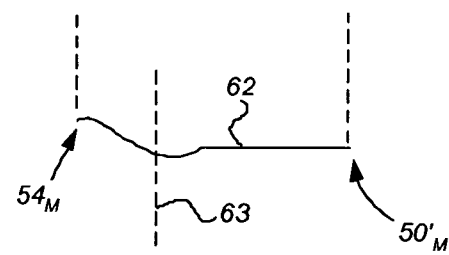
FIG. 11 shows a measured height profile of the calibration plate of FIG. 9.

FIG. 11 shows a measured height profile 62 measured after rotation. In a method according to one embodiment of the invention, one of the height profiles is reversed. For example, every height point $Z(y_i)$ of the measured height profile 62 may be mirrored in an arbitrary mirror line, perpendicular to an y-axis of the height profile 62. In FIG. 11, the mirror line is indicated by 63.

Figure 12:
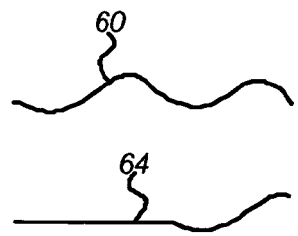
FIG. 12 shows the measured height profile of FIG. 10 and a mirrored version of the height profile of FIG. 11.
Figure 13:
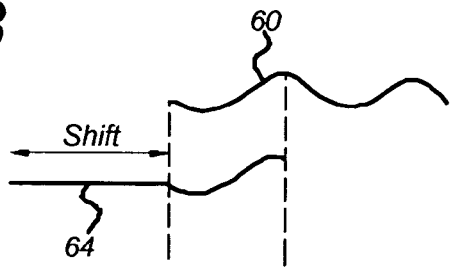
FIG. 13 shows the height profiles of FIG. 12, but with the first height profile shifted to the right.

FIG. 12 shows a height profile 64 which is the measured height profile 62 of FIG. 11 after mirroring. Then, the height profiles 60 and 64 are aligned in such a way that the beginnings $50_M$, $50'_M$ are at the same y position. Next, at least one of the profiles (e.g. the measured height profile 60) is shifted in the y-direction until best-fit alignment of height profiles 60, 64 is found (e.g. a relative displacement at which identical parts of the height profiles 60, 64 are aligned). The amount of shift (e.g. the distance between $50_M$ and $50'_M$ after such shifting) is called shift_y, and is shown in FIG. 13.

Finding a best-fit alignment of the height profiles 60 and 64 may be performed using a software mechanism using a least square fit calculation. Other methods may also be used to determine a best-fit alignment (e.g. a displacement or shift at which a distance between the profiles or surfaces is minimized with respect to other relative displacements or shifts). For reasons of clarity, the mirrored height profile 64 in FIGS. 12 and 13 is shown beneath the first profile 60. It should be clear to the reader that the portions of these two profiles between the dotted lines are superpositioned.

If the initial measuring point 50, 50' of the height sensor 10 would have been exactly the same as the position of the X,Y alignment marker 42, the shift_y would have been zero. But since such a coincidence may not be the case in practice, shift_y may not be equal to zero, and the difference between the measuring position 50 of the height sensor and the position 42 of the X,Y alignment marker 40 can be calculated using formula:

$$d_{AA\_HS} = shift\_y/2.$$

In a method according to an embodiment of the invention, finding an overlap of the height profiles 60 and 64 may be performed by calculating a surface between the height profile 60 and the mirrored height profile 64 and shifting at least one of the height profiles (e.g. the height profile 60) in the Y-direction until the surface is minimized.

Figure 14:
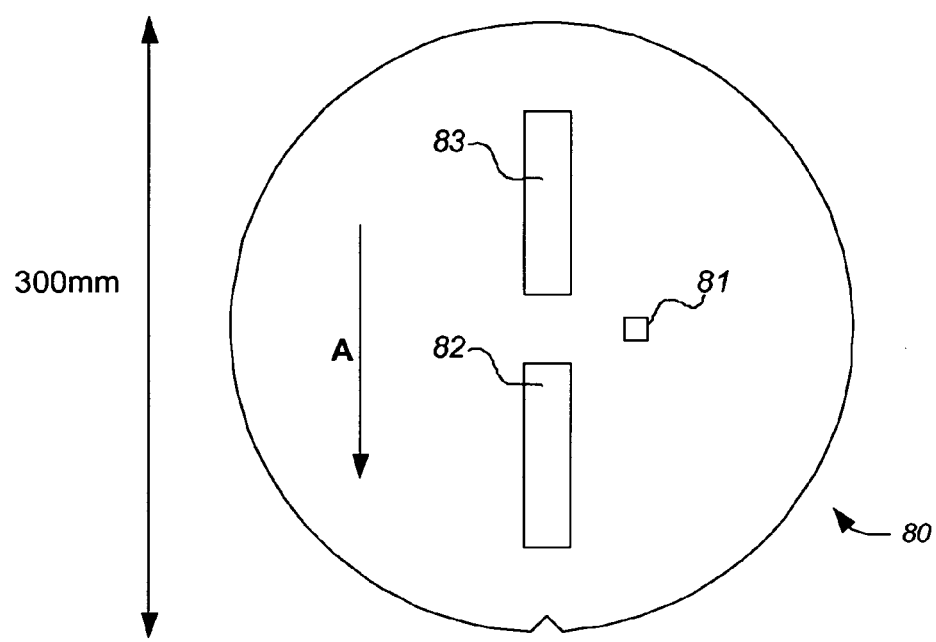
FIG. 14 shows a top view of a calibration wafer according to an embodiment of the invention.

In FIG. 14, an embodiment of a calibration wafer 80 is shown which comprises an alignment marker 81, a height profile 82, and a reference area 83. Height profile 82 is directed in a direction A as indicated by FIG. 14. In a calibration method according to one embodiment of the invention, the calibration wafer 80 is placed on the substrate table WT. First, the alignment marker 81 is looked for, and then the calibration plate 38 (i.e. the calibration wafer 80) is moved in a direction opposite to direction A. While moving the calibration plate 38, height profile 82 and the reference area 83 are measured by the height sensor 10. It should be noted that the height profile may be measured moving the calibration plate 38 first a certain distance in the opposite A direction, and then measuring the height profile 82 while moving the calibration plate 38 in the A direction.

Next, the calibration plate 38 is rotated 180 degrees and height profile 82 is measured again by the height sensor 10. These two measured height profiles are used to calculate $d_{AA\_HS}$. It may be desirable or necessary to remove the calibration wafer from the substrate table WT, e.g. in order to rotate the calibration wafer elsewhere and replace it on the substrate table. Such a procedure may cause position-related errors, e.g. due to factors such as differences in flatness of the chuck at the place where the height profile was situated on the chuck before and after rotation position. In order to compensate for such errors, in a method according to a further embodiment of the invention, the height profiles of the reference area 83 are also measured and subtracted from the measured height profiles of the height profile 82. In order for a calibration operation to work properly, it may be desirable or necessary for the reference area to be arranged at an appropriate location on the calibration wafer.

In order to calibrate the X,Y-position of the measurement point of the height sensor in a direction perpendicular to the direction A, the calibration plate 38 can be rotated 90 degrees and the height profile 82 can be measured another two times by the height sensor 10. It is noted that the calibration plate 38 may comprise more than one alignment marker. FIG. 14 shows a calibration wafer with a cross section of 300 mm, but other cross sections are possible.

Figure 15:
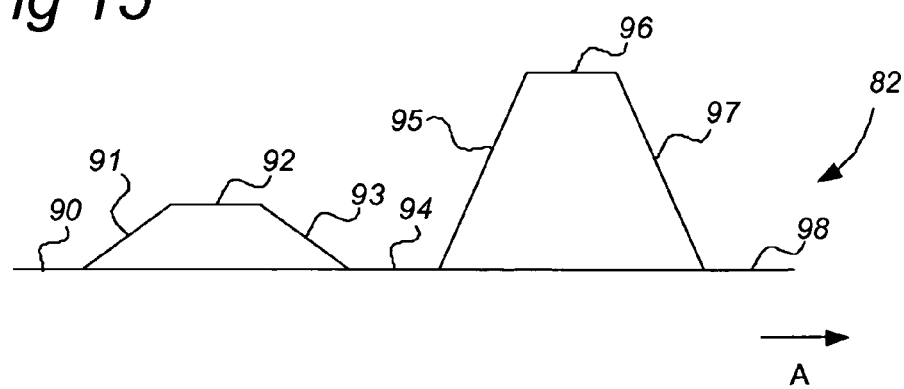
FIG. 15 shows a side view of a possible height profile.

In a method according to an embodiment of the invention, the height profile 82 comprises a pattern with a plurality of sloped and unsloped planes, wherein the sloped planes have a number of slopes with reference to the unsloped planes. In FIG. 15, an example of such an embodiment is shown in cross-section. The height profile 82 comprises unsloped planes 90, 92, 94, 96, 98 and sloped planes 91, 93, 95, 97. In this example, sloped planes 91 and 93 have the same slope but different than the slopes of sloped planes 95, 97. Using a height profile comprising planes with different slopes may be advantageous, e.g. because it may be possible to obtain a greater accuracy when shifting and comparing the measured height profiles.

Embodiments of the present invention include methods of calibrating a lithographic apparatus, and a lithographic apparatus calibrated using such a method. Other embodiments of the invention include device manufacturing methods.

A method of calibrating an X,Y position of a measurement point of a height sensor of a lithographic apparatus according to one embodiment of the invention includes providing a calibration plate comprising at least one alignment marker to be located by an X,Y alignment sensor, and at least one height profile to be measured by the height sensor; positioning the calibration plate in the lithographic apparatus using the X,Y alignment sensor, so that the alignment marker is in a first X,Y position and the height sensor is allowed to measure a height in a second X,Y position; measuring the at least one height profile using the height sensor, giving a first measured height profile; rotating the calibration plate substantially 180 degrees; positioning the calibration plate in the lithographic apparatus using the X,Y alignment sensor, so that the alignment marker is in the first X,Y position and the height sensor is allowed to measure a height in the second X,Y position; measuring the at least one height profile using the height sensor, giving a second measured height profile; calculating the difference between the first and the second X,Y position using the first and second measured height profile; calibrating the measurement point using the difference.

By rotating the calibration plate substantially 180 degrees, it may be possible eliminate the inaccurately known distance between the height profile and the alignment marker from the calculation. So, the calibration of the X,Y position of the measuring spot of the height sensor with reference to the position of the X,Y-alignment marker may be possible without a need to know the exact distance between the height profile and the alignment marker.

The term 'substantially 180 degrees' is intended to mean 180 degrees or close enough to 180 degrees to allow such a method to produce a usable result. An equivalent scope is intended for the term 'substantially 90 degrees' and the term 'substantially perpendicular'.

A method according to an embodiment of the invention may be performed using a calibration plate that comprises an alignment marker and a height profile, and wherein tasks as mentioned herein are repeated after rotating the wafer stage substantially 90 degrees. In this way, the calibration of two perpendicular directions may be performed using only one height profile. The calibration plate may be arranged on the substrate table or on a specially made calibration wafer.

A calibration plate according to a further embodiment of the invention includes at least one reference area, a height profile of which is measured before and after rotating the calibration plate 180 degrees. By doing so, a third and a fourth measured height profile are provided. In one method using such a plate, the third measured height profile is subtracted from the second measured height profile, and the fourth measured height profile is subtracted from the first measured height profile. By subtracting these height profiles, errors due to differences in flatness of the chuck, at places where the calibration plate is placed on the substrate table before and after rotation, can be compensated, as well as other position-related errors.

Embodiments of the invention also include lithographic apparatus calibrated according to a method as described herein and device manufacturing methods using such apparatus.

Whilst specific embodiments of the invention have been described above, it will be appreciated that the invention as claimed may be practiced otherwise than as described. For example, calibration methods as described herein are not limited to the calibration of dual stage apparatus. Such methods may also be used in applications other than tilt axis calibration. At least some of these methods may be used, for example, in any situation wherein calibration of a height sensor is needed with reference to an alignment system. Additionally, although calibration along a Y-direction is discussed herein, such methods include calibration along other directions (e.g. an X-direction) as well, whether additionally or in the alternative.

Embodiments of the method may also include one or more computers, processors, and/or processing units (e.g. arrays of logic elements) configured to control an apparatus to perform a method as described herein, or a data storage medium (e.g. a magnetic or optical disk or semiconductor memory such as ROM, RAM, or flash RAM) configured to include instructions (e.g. executable by an array of logic elements) describing such a method. It is explicitly noted that the description of these embodiments is not intended to limit the invention as claimed.

What is claimed is:

1. A method of calibration, said method comprising:
   moving a marker of a calibration plate to an alignment position;
   using a height sensor to measure a first height profile of the calibration plate;
   subsequent to said moving the marker and using the height sensor to measure the first height profile, rotating the calibration plate by substantially 180 degrees;
   subsequent to said rotating, moving the marker to the alignment position again;
   subsequent to said rotating, using the height sensor to measure a second height profile of the calibration plate; and
   determining a position of a measurement spot of the height sensor with respect to the alignment position, based on the first and second height profiles.

2. The method of calibration according to claim 1, wherein at least one among the first and second height profiles includes measurements of a first plane of the calibration plate and measurements of a second plane of the calibration plate that is sloped with respect to the first plane.

3. The method of calibration according to claim 1, wherein at least one among the first and second height profiles includes measurements of a successive plurality of planes of the calibration plate, each among the successive plurality of planes having a different slope than an adjacent one among the successive plurality of planes.

4. The method of calibration according to claim 1, further comprising providing a wafer that contains the calibration plate.

5. The method of calibration according to claim 1, further comprising arranging the calibration plate on a substrate table.

6. The method of calibration according to claim 1, wherein the first height profile includes a first measurement of a feature of the calibration plate, and
   wherein the first height profile includes a second measurement of the feature of the calibration plate, and
   wherein determining the position of the measurement spot of the height sensor is based on the first and second measurements.

7. The method of calibration according to claim 6, wherein determining the position of the measurement spot of the height sensor is based on a difference between the first and second measurements.

8. The method of calibration according to claim 6, wherein the feature includes an intersection of two planes, the planes being sloped with respect to each other.

9. The method of calibration according to claim 1, said method further comprising:
   subsequent to said using the height sensor to measure the second height profile, further rotating the calibration plate by one among substantially 90 degrees and substantially 270 degrees, and
   subsequent to said further rotating, using the height sensor to measure a third height profile of the calibration plate.

10. The method of calibration according to claim 9, wherein said determining the position of the measurement spot of the height sensor is based on the third height profile.

11. The method of calibration according to claim 1, further comprising determining a best-fit alignment of one among the first and second height profiles and a reversed version of the other among the first and second height profiles,
wherein determining the best-fit alignment includes determining a relative displacement of the one profile and the reversed version of the other profile corresponding to the alignment.

12. The method of calibration according to claim 11, wherein determining the position of the measurement spot of the height sensor is based on said relative displacement.

13. The method of calibration according to claim 11, wherein determining the best-fit alignment includes calculating, for each of a plurality of relative displacements between the one profile and the reversed version of the other profile, a corresponding difference between the one profile and the reversed version of the other profile.

14. The method of calibration according to claim 11, wherein determining the best-fit alignment includes applying a method of least-squares.

15. The method of calibration according to claim 1, further comprising:
prior to said rotating, using the height sensor to measure the first height profile of a reference area of the calibration plate; and
subsequent to said rotating, using the height sensor to measure the second height profile of the reference area of the calibration plate,
wherein said determining the position of the measurement spot of the height sensor is based on at least one among the first and second height profiles of the reference area.

16. The method of calibration according to claim 15, further comprising, prior to said determining the position of the measurement spot of the height sensor, modifying at least one of the first and second height profiles according to at least one among the first and second height profiles of the reference area.

17. The method of calibration according to claim 1, further comprising projecting a patterned beam of radiation onto a target portion of a radiation-sensitive material that at least partially covers a substrate,
wherein said projecting is based on said determining the position of the measurement spot of the height sensor.

18. The method of calibration according to claim 17, wherein said projecting includes measuring a height of the substrate, and
wherein said measuring the height of the substrate is based on said determining the position of the measurement spot of the height sensor.

19. A device manufactured according to the method according to claim 17.

20. The method of calibration according to claim 17, wherein said projecting includes positioning the substrate, and
wherein said positioning is based on said determining the position of the measurement spot of the height sensor.

21. The method of calibration according to claim 20, wherein said positioning includes rotating the substrate around an axis parallel to a surface of the substrate, and
wherein said rotating the substrate is based on said determining the position of the measurement spot of the height sensor.

22. The method of calibration according to claim 1, wherein said moving the marker includes moving a substrate table of a lithographic apparatus.

23. The method of calibration according to claim 22, wherein said rotating the calibration plate includes removing the calibration plate from the substrate table.

24. A device manufacturing method, said method comprising:
moving a marker of a calibration plate to an alignment position;
using a height sensor to measure a first height profile of the calibration plate;
subsequent to said moving the marker and using the height sensor to measure the first height profile, rotating the calibration plate by substantially 180 degrees;
subsequent to said rotating, moving the marker to the alignment position again;
subsequent to said rotating, using the height sensor to measure a second height profile of the calibration plate;
determining a position of a measurement spot of the height sensor with respect to the alignment position, based on the first and second height profiles;
using a radiation system to provide a beam of radiation;
using a patterning structure to pattern the beam of radiation according to a desired pattern; and
projecting the patterned beam onto a target portion of a layer of radiation-sensitive material that at least partially covers a substrate,
wherein said projecting includes positioning the substrate based on said determining the position of the measurement spot of the height sensor.

25. The device manufacturing method according to claim 24, wherein said positioning includes measuring a height of the substrate, based on said determining the position of the measurement spot of the height sensor.

26. The device manufacturing method according to claim 25, wherein said positioning includes rotating the substrate around an axis parallel to a surface of the substrate, and
wherein said rotating the substrate is based on said determining the position of the measurement spot of the height sensor.

27. A method of calibration, said method comprising:
providing a calibration plate having at least one alignment marker;
positioning the calibration plate in a lithographic apparatus using an alignment sensor, such that the at least one alignment marker is in a first X,Y position and a measurement point of a height sensor of the lithographic apparatus corresponds to a second X,Y position;
measuring a first height profile of the calibration plate using the height sensor;
rotating the calibration plate by substantially 180 degrees;
subsequent to said rotating, positioning the calibration plate in the lithographic apparatus using the alignment sensor, such that the alignment marker is in the first X,Y position and the measurement point of the height sensor corresponds to the second X,Y position;
subsequent to said rotating, measuring a second height profile of the calibration plate using the height sensor;
calculating a difference between the first and second X,Y positions based on the first and second height profiles; and
calibrating the height sensor based on the difference.

* * * * *